United States Patent [19]
Dill et al.

[11] 3,989,385
[45] Nov. 2, 1976

[54] PART LOCATING, MASK ALIGNMENT AND MASK ALIGNMENT VERIFICATION SYSTEM

[75] Inventors: Frederick H. Dill, South Salem; Jan P. Hoekstra, Putnam Valley, both of N.Y.

[73] Assignee: International Business Machines Corporation, Yorktown Heights, N.Y.

[22] Filed: Sept. 16, 1974

[21] Appl. No.: 506,647

[52] U.S. Cl. .............................. 356/152; 250/548; 250/571; 350/6; 356/169
[51] Int. Cl.² ........................................ G01B 11/26
[58] Field of Search .......... 356/150, 152, 156, 169, 356/172; 250/548, 571; 350/6

[56] References Cited
UNITED STATES PATENTS

| | | | |
|---|---|---|---|
| 3,287,562 | 11/1966 | Connors, Jr. et al. | 250/203 R |
| 3,327,584 | 6/1967 | Kissinger | 356/4 |
| 3,378,687 | 4/1968 | Schepler | 356/151 |
| 3,448,280 | 6/1969 | Blitchington et al. | 250/227 |
| 3,497,705 | 2/1970 | Adler | 250/201 |
| 3,544,801 | 12/1970 | Dyck | 250/237 R |
| 3,614,448 | 10/1971 | Diprose et al. | 250/202 |
| 3,630,594 | 12/1971 | Gorog | 350/7 |
| 3,704,372 | 11/1972 | Parker | 250/202 |
| 3,704,949 | 12/1972 | Thomas et al. | 350/6 |
| 3,790,276 | 2/1974 | Cook et al. | 356/152 |
| 3,821,545 | 6/1974 | Nakagawa et al. | 250/201 |
| 3,885,877 | 5/1975 | Horwath et al. | 356/152 |

*Primary Examiner*—Richard A. Farley
*Assistant Examiner*—S. C. Buczinski
*Attorney, Agent, or Firm*—Pollock, Vande Sande & Priddy

[57] ABSTRACT

A method and apparatus for locating target patterns with reference to a fixed axis. The apparatus includes a collimated light source providing a light beam to a rotating prism and optical flat producing a rotating light beam. A lens whose axis is the fixed axis focuses the beam to a spot on a surface containing a pattern comprising regularly spaced light scattering surfaces. A light sensor detects light from the rotating beam scattered by the target. An incremental shaft encoder provides a real time indication of spot position. The light sensor output provides a measure of target location and orientation with reference to the lens axis. The encoder can be used to control sampling apparatus and an A/D converter to provide regular digital samples of the light sensor output.

The method includes providing a target with regularly spaced light scattering areas, rotating a light beam about an axis, detecting the scattered light and determining from the relative radial spot position at the time scattered light is detected the relationship between the beam axis and the target axis and orientation.

The basic apparatus and method referred to above is useful in the manufacture of integrated circuits.

More comprehensive apparatuses and methods are disclosed which employ the basic method and apparatus to determine mask alignment and perform mask alignment verification in the manufacture of integrated circuits.

18 Claims, 6 Drawing Figures

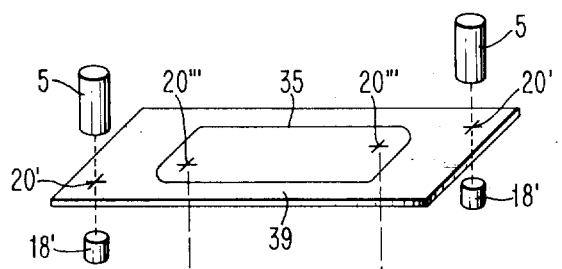
FIG. 5
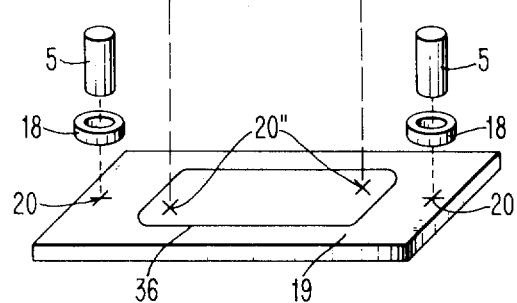
FIG. 6
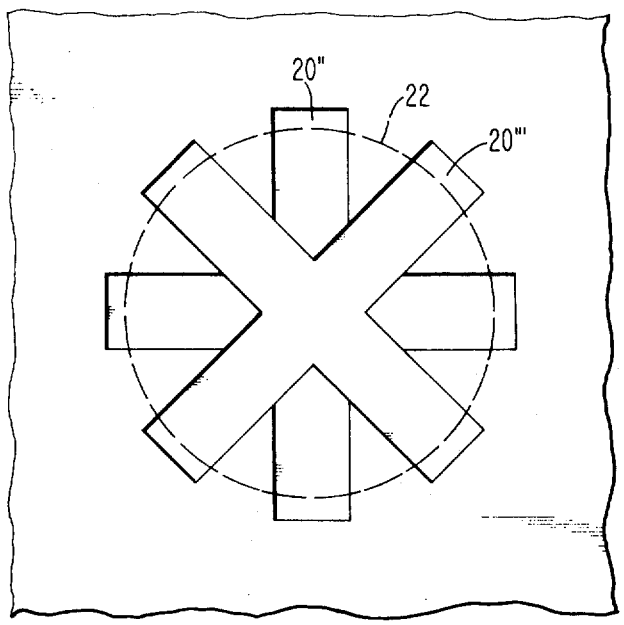

PART LOCATING, MASK ALIGNMENT AND MASK ALIGNMENT VERIFICATION SYSTEM

FIELD OF THE INVENTION

This invention pertains to systems for precisely locating parts with respect to a fixed reference. The invention also includes locating the relative positions of two objects with respect to a reference. The invention finds particular utility in the manufacture of integrated circuits.

BACKGROUND OF THE INVENTION

In the manufacture of integrated circuits as it is conventionally practiced, a substrate or wafer is provided and then different materials are deposited, in layers, on the substrate in different patterns relating to the functions which are to be performed by the different layers of materials. In effect an integrated circuit component may comprise a plurality of different layers. Since the different material layers deposited on the substrate are designed to interact with adjacent layers, the patterns which are used to deposit the material in any layer must be precisely located with reference to adjacent layers. In the fabrication of integrated circuits optical techniques are conventionally employed for transferring to the partially completed integrated circuit, a pattern to be used in depositing the material of any particular layer. The apparataus for transferring patterns and depositing materials must necessarily be located adjacent the wafer. The physical positioning of this apparatus severely restricts the characteristics of supplementary apparatus which may be used to locate the pattern transferring and material depositing apparatus, for aligning the different masks used for transferring the patterns and for verifying that the material has been deposited in proper locations. As a result the most widespread method for locating and verifying the position of parts and patterns on a wafer includes a human being peering through a microscope. The difficulties with this method should be obvious even to those not skilled in the art and flow chiefly from the characteristic frailties of the human being.

Another method which has been suggested, for at least verifying the proper location of the various parts comprising integrated circuit, includes apparatus which operates on samples of the integrated circuit after they have been manufactured. Of course, this apparatus does not have to contend with the apparatus which is necessary to the manufacturing operation. As such the verifying steps can be performed physically separate from the manufacturing steps. The difficulty with this method, however, is that if the part location is not verified there is nothing that can be done to correct the situation other than discarding the integrated circuit and beginning anew. In a nutshell this after-the-fact testing can only be used to separate the acceptable from the unacceptable and cannot be used to guide the manufacturing operation so as to maximize the yield of the manufacturing process.

SUMMARY OF THE INVENTION

The present invention overcomes the foregoing and other disadvantages by employing the inventive apparatus and method disclosed herein. For part locating apparatus and method a rotating beam of light is focused to a spot, as defined hereinafter, on the surface to be located. The surface is provided with a target having regularly spaced light scattering edges. The rotating beam may be produced by a rotating prism and optical flat. The rotating optical components also carry an incremental shaft encoder to provide real-time data as to the angular position of the spot about the axis. A light detector is arranged to detect light scattered by the target edges. A photomultiplier or similar apparatus provides an electrical signal related to the scattered light. By recording the electrical signal at pre-determined spot positions the location and orientation of the target with respect to the axis can be determined. Alternatively, or in additiion, the electrical signals, fed through an A/D converter controlled by encoder output may be input to a digital computer programmed to determine position and orientation.

The foregoing apparatus may also be used for mask alignment and photoresist pattern alignment verification.

Mask alignment is carried out using the part positioning apparatus to determine position of a wafer with respect to a first fixed axis and by using modified apparatus to locate a mask with respect to a second fixed axis. Of course, the relationship of the two axis must be known. The modified apparatus uses a similar rotating light spot and incremental encoder. However, the mask target is light blocking rather than light scattering. Therefore, a light sensor is located on the side of the mask opposite the light source and other optical components. The sensor detects light transmitted through the mask and therefore the target position is determined from the spot positions at which light is blocked. The output from this sensor is an electrical signal for recording, conversion to digital form and data reduction.

The photoresist pattern location verifying system employs a target on the wafer and other apparatus similar to the target and apparatus described for part positioning determination. The mask includes a pattern of a similar target in a position to overlie the wafer target when the photoresist is exposed and developed. However, the mask pattern produces a target, in the photoresist, which is rotated with respect to the wafer target under correct alignment. Since the light will be scattered from both photoresist and wafer targets, the sensor will detect light scattered from both. Similar data reduction techniques allow verification of pattern location and orientation to be effected.

It will be appreciated that the part position locating apparatus may be compact and wafer positioning may be determined from targets outside the area to be exposed by a mask. As such the components will not interfere with the optical transfer of a pattern from a mask to the wafer. The mask alignment apparatus may employ wafer targets outside the area to be exposed by a mask so this too will not interfere with the manufacturing steps. The mask targets may be outside the pattern occupied area of the mask so the apparatus will not interfere with the mask-wafer pattern transfer. The photoresist pattern locating verifying components necessarily overlie the exposed wafer areas, however, the verifying step may be effected at a location other than the one used in the exposing step of manufacture. The advantage of reusability is retained, however, since a misaligned photoresist pattern may be washed off and a new photoresist used. This method, then, saves the partially completed integrated circuit if a misaligned pattern is detected.

BRIEF DESCRIPTION OF THE DRAWINGS

In describing the present invention, reference will be made to the several figures of drawings accompanying this application in which like reference characters identify identical apparatus and in which;

FIG. 5 is a part schematic part isometric view of a mask alignment system, and

FIG. 6 is a plan view of targets used for pattern location verification.

DETAILED DESCRIPTION OF THE INVENTION

Figure 1:
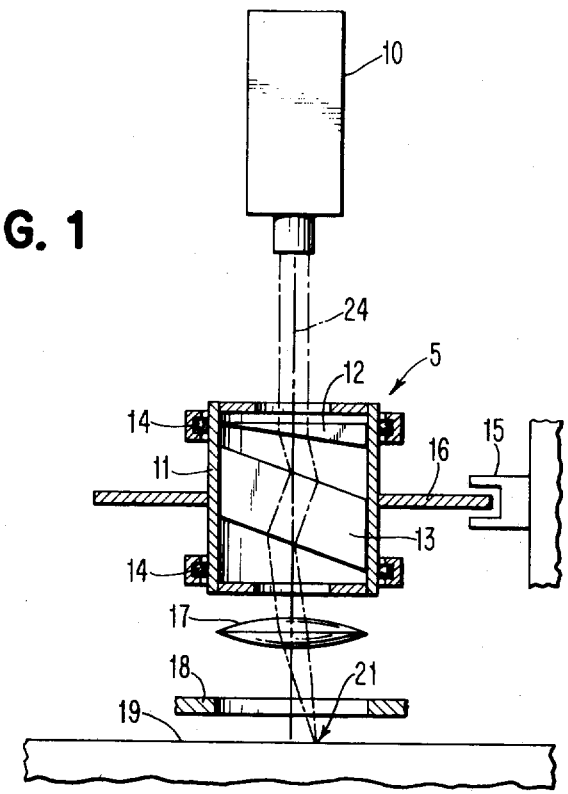
FIG. 1 is a representation of the basic measuring apparatus, partly schematic and partly in cross section.

FIG. 1 is a representation of the basic measuring apparatus of the present invention for deriving signals representative of the positioning of the part or pattern. As should be clear from FIG. 1 the optical apparatus is shown in a cross section for more ready comprehension. In FIG. 1 a part 19 is illustrated, in cross section, and is the part whose position is to be determined. The apparatus of the present invention allows position location of the part 19 with reference to axis 24 of the lens 17. Preferably, part 19 has been coarsely located by conventional means. For instance, part 19 may comprise a wafer with one edge which includes a notch or locating cut. In order to precisely locate part 19, a target pattern, such as the pattern 20 illustrated in FIG. 2, is located thereon.

Figure 2:
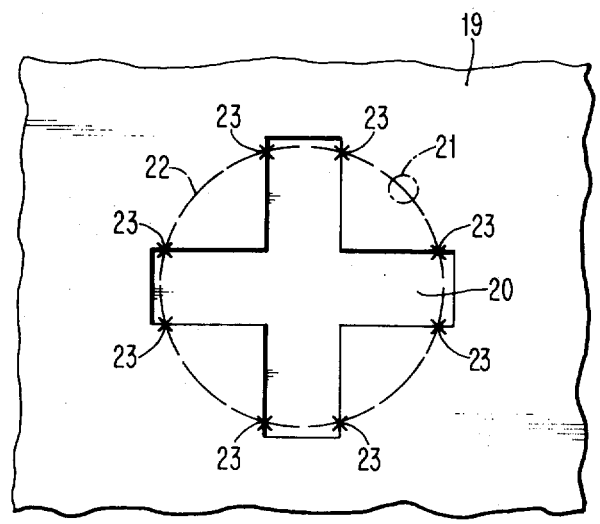
FIG. 2 is a representation of a preferred target.

FIG. 2 is a plan view of a preferred embodiment of a target pattern on the part 19. The pattern comprises a cruciform arrangement where the cruciform is located on a different level than the remaining portions of part 19. The cruciform may be etched away by conventional techniques in the art. It is one of the important advantages of te present invention that the exact dimensions of the cruciform are not critical. Thus, the width of any of the cruciform legs is not a crucial characteristic of the present measuring system. Rather, as will become more clear hereinafter, the present invention relies upon the symmetrical relationship of the legs to determine location. Therefore, under or over etching of the crucifrm is of no consequence to the present measuring system. The target pattern can thus be characterized as a line pattern such as 20' which provides for scattering light.

Returning now to FIG. 1, a light source 10 produces a beam of collimated light. One light source which has been used in a system built in accordance with the teachings of the present invention is a laser, and particularly a helium-neon laser. This type of laser is particularly suitable for it will not expose a photoresist. However, it will be apparent to those skilled in the art that other light sources can be utilized. A light beam from the light source 10 is suitably shaped by optical components including prism 12, optical flat 13 and lens 17.

More particularly, a cylindrical barrel 11 is rotably mounted on bearings 14 for rotatable movement. The apparatus driving the barrel 11 is not shown but it may be a conventional motor. Barrel 11 includes a thin optical prism 12 and an optical flat 13. The prism 12 deviates the light from the source 10 through an angle which is given by the formula:

$$DEV = (n-1)w$$

Where:
- $n$ is the index of refraction of the prism
- $w$ is the wedge angle of the prism The optical flat 13 is mounted at a fixed angle with respect to the lens axis. The angle of the optical flat and the distance from the optical flat to the prism are determined as follows. The function of the optical flat 13 is to displace the light emitted from the prism 12 so that it strikes the lens 17 centrally. Thus, the angle of optical flat 13 with respect to the lens axis 17 and the distance between the flat 13 and the prism 12 can be determined once the positioning of lens 17 is determined with reference to the prism. As the barrel 11 carrying the prism 12 and optical flat 13, rotates, the light beam is rotated about the optical axis of the lens 17.

Also located on the barrel 11 is an incremental shaft encoder 15 and 16. The optical encoder is used to keep track of the rotational position of the barrel 11. In addition, a reference mark in the optical encoder is used for synchronizing purposes. The particular form of encoder is of no consequence, many suitable encoders are known in the art.

As the barrel 11 rotates the prism 12 causes the light beam to deviate about the rotational axis of the barrel 11. Assuming that this axis is reasonably close to the axis of the lens 17, the beam is caused to rotate about the axis of lens 17. The light source 10 is spaced from the lens 17 by a convenient distance. The part 19 is spaced from the lens 17 by a distance equal to the focal length of lens 17. As a result, the light beam is focused to a spot on the part 19 by the lens 17. In this regard the term "spot" as used in this description, and in the claims appended hereto, refers to a realizable spot and not to the theoretical spot of infinitesimal size.

Figure 3:
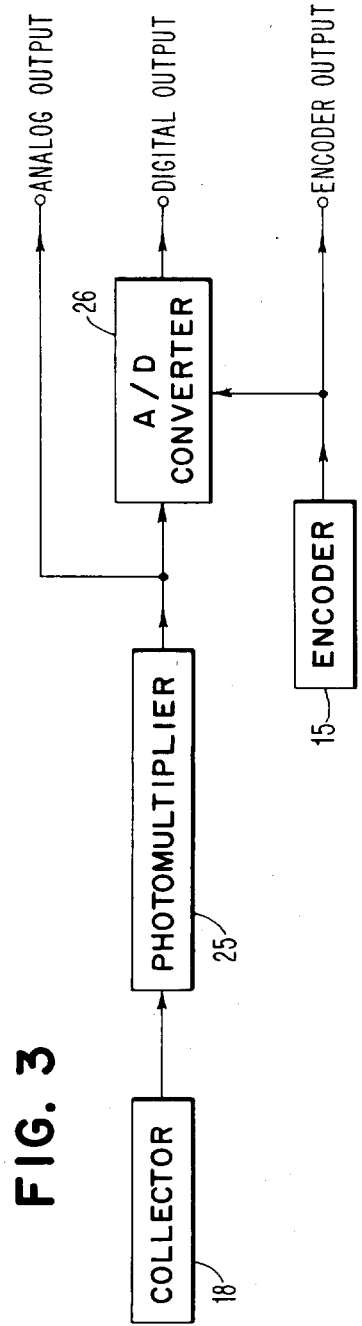
FIG. 3 is a schematic block diagram of the signal reduction components.

As the spot rotates light is scattered from the edges of the cruciform target as the focused spot encounters the target edges. The measurement is made in a dark field and an annular or ring shaped light collector 18 is provided in order to collect the scattered light. On a specular surface with no steps or edges, no light will be scattered into the light collector. When the spot scans across an edge, such as 20' however, light will be scattered into the ring collector. The collector 18 can be a conventional optical path such as used in dark-field microscope illuminators or it can be a ring of optical fibers. The latter is attractive since it may be broken down into angular sectors to provide signal to noise ratio advantages if such advantage is deemed necessary. The collector 18 is connected to a photomultiplier (or equivalent) or photomultipliers, as is illustrated in FIG. 3. Preferably, the collector 18 is arranged in a low-angle configuration to pick up light scattered from perhaps 30° to 80° off the axis of the lens 17.

FIG. 3 is a block diagram of the signal dectecting arrangement for use with the measuring equipment illustrated in FIG. 1. In FIG. 3, the light detector comprises collector 18 connected to a photomultiplier 25. Although only one collector 18 and photomultiplier 25 are illustrated, it will be understood that if the collector 18 is divided into segments, there will be a plurality of collectors 18 and one photomultiplier for each collector. In any event, the output of the photomultiplier can be provided to an analog to digital converter 26 for providing a digital output representative of the light signals received at the collector 18. The encoder 15 is connected to the analog to digital converter 26 to produce digital samples at specified intervals. Conveniently, 256 or more samples can be taken per revolution. In addition, an output is available from encoder 15. This output could be used, for instance, to drive a chart recorder to record the analog output from photomultiplier 25. Alternatively the output can be provided to computer to be displayed on a plotter.

Figure 4:
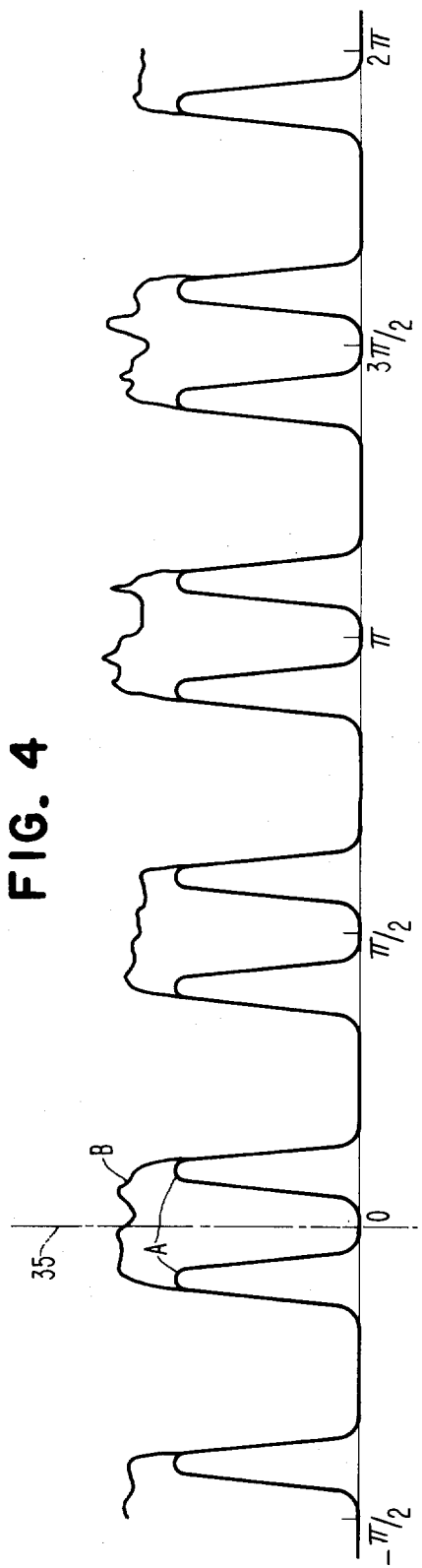
FIG. 4 is an illustrative showing of analog signal outputs of the measuring apparatus.

FIG. 4 illustrates the two representative types of output signals which could be displayed or recorded. In FIG. 4, the X axis is scaled in terms of the revolution of the light beam. The Y axis records the amplitude of light detector output. For each leg of the cruciform two representative types of outputs are shown, A and B, respectively. The form of the light detector output depends upon a number of factors. The diameter of the spot focused by the lens 17 is significant as is the width of the legs of the target 20. The curve A illustrates a representative output when the width of the target legs is wide compared to the spot size. In particular, curve A illustrates that each edge of the target is separately defined. On the other hand, if the spot size is on the order of the width of the legs of the target a curve such as B will be produced. Curve B illustrates that for each leg of the target a single "pulse" is produced. The measuring system of our invention can be used with either of these two representative types of outputs, and similarly with an output which lies between these two extremes. FIG. 4 thus illustrates the fact that the width of the target legs is not at all crucial to the operation of this measuring system.

In order to determine whether or not the part 19 is accurately positioned one determines the symmetrical axis, such as 35, for either the "pulse" B or the symmetrical axes for the two "pulses" A. After each of the symmetrical axis has been determined the angular distance between them is an indication of the location of the part. In actual operation a number of measurements may be made to enhance the signal-to-noise ratio. For instance, if the distance between each of the symmetrical axis related to each of the target legs is equi-distant, then the target axis is aligned with the axis of the lens 17 which forms the reference for the system. Variations in distances between the axis of symmetry for the pulse groups associated with each of the target legs can clearly be related to mislocation of the part 19 with respect to axis 24. By performing this operation at two relatively widely separated targets on a wafer, the wafer can be accurately positioned for subsequent operations. Apparatus built in accordance with the teachings of this invention employed a lens 17 with a one centimeter focal length. The diameter of the scan was 0.1 millimeter. In order to align the light source 10 on the axis of lens 17 the barrel 11 was removed and a mirror located in the space occupied by part 19 in FIG. 1. This allowed the light from source 10 to be reflected back on itself for alignment purposes. It is well within the conventional techniques to align the light source axis parallel to the lens axis within a 0.1°. This provides a spot location accurate to about 0.25 micrometers. It should be apparent that, with the focused beam describing a circle of diameter of 0.1 millimeters, the target legs should have a length preferably greater than 0.05 millimeters. The apparatus described above will enable the part 19 to be accurately positioned so long as the focused spot "sees" at least part of the target.

In addition to locating the part 19 which may comprise a wafer the apparatus of this invention may also be utilized to perform mask alignment and mask alignment verification prior to and subsequent to exposing a photoresist on the wafer 19.

For proper mask alignment there must exist a predetermined relationship between the mask and the wafer. FIG. 5 illustrates the manner in which the apparatus of this invention may be employed to perform a mask alignment operation. In FIG. 5, a wafer 19 has a pair of targets 20. Associated with each of the targets 20 is optical apparatus 5 to provide a rotating focused spot on the wafer 19 surface. Also associated with each of the targets 20 is an annular light collector 18 of the type referred to above. A mask 39 is located adjacent the wafer 19 so that the mask image 35 may be projected onto the wafer 19, by apparatus not illustrated. Prior to actually exposing the wafer 19, which has been coated with a photoresist, it is necessary to align the mask image with reference to the images previously impressed on the wafer. To this end, a pair of targets 20' are provided on the mask 39. Associated with each of the targets 20' is optical apparatus 5 which comprises means for generating a rotating spot focused on the mask 39. Since the mask 39 is light transmissive, positioning the mask 39 can be performed using the light transmission capabilities of the mask. To this end, light detectors including collectors 18' are associated with each of the targets to sense light transmitted through the mask. The targets 20' on the mask are designed to inhibit the transmission of light. As a result, the detectors will detect a signal which resembles the complement of the signals illustrated in FIG. 4. Using similar symmetry techniques the mask 39 can then be accurately positioned in a predetermined relationship with the wafer 19 so long as there exists a fixed relationship between the axis of the various lenses 17 associated with each of the spot producing components. This data reduction necessary to determine the positional relationship between wafer 19 and mask 39 are particularly suited to computer operation.

The present invention can also be employed for alignment verification measurements. In particular, it is often desirable to determine, after a photoresist has been exposed and developed, whether or not the developed photoresist is accurately aligned with the substrate. It is advantageous to determine this prior to the etching operation so that, if the photoresist exposure was not accurately aligned with the substrate, the photoresist can be washed off and a new photoresist can be exposed and developed. If this is possible, of course, the misaligned photoresist can be dispensed with without sacrificing the substrate and the effort which had gone into partially completing the manufacture of the wafer. Such a technique is possible using the principles and apparatus of the present invention.

More particularly, FIG. 5 also illustrates that the wafer has a pair of targets 20'' in the area 36 which is to be exposed by the mask 39. These targets 20'' do not lie in the photoresist but lie in the plane below the photoresist, having been etched by previous operations. Included within the area 35 of the mask 39 which forms an image on the wafer 19 lies another pair of targets 20'''. These targets 20''' are positioned so as to overlie the targets 20'' but, are rotated with respect to the targets 20''. A rotation of 45° is preferable, although not essential. As a result of the position and orientation of the targets 20''', when the mask 35 exposes the photoresist overlying the wafer 19 it will also expose images of the targets 20'''. When developed in the photoresist the target 20''' will overlie the target 20''. Since the developed photoresist exhibits steps or edges at the edges of the target 20''' an optical system 5 such as illustrated in FIG. 1 can be employed along with an annular light collector 18 to obtain signals from the edges of both targets 20'' and 20'''. By examination of these signals the alignment between the developed photoresist and the wafer 19 can be determined. Furthermore, this determination can be made prior to using the photoresist in a deposition or etching process. Thus, if the photoresist, as developed, is misaligned it can be washed off and a new photoresist exposed and developed prior to the deposition. In this manner, one can determine that the photoresist is accurately aligned on the wafer before the deposition process.

It is physically possible to determine positioning of the part 19 from an analog recording of the type which is illstrated in FIG. 4. Thus, one can, by eye, or with a ruler, determine the symmetry points for each of the "pulses" or "pulse groups". After determining each of the symmetry points one can then use the ruler again to determine the relative spacing there-between and thus determine the alignment or misalignment with the axis of the lens 17. However, the digital output from analog to digital converter 26 can be provided to a computer which can perform the same function by use of conventional programs. These programs may merely reproduce the ruler type measurements referred to above or they can be more complex involving curve fitting and Fourier transforms. A further significant advantage is obtained by the use of a computer to analyze the output of the light detectors. With the more sophisticated apparatus made available by the computer it is no longer necessary to exactly center the axis of the target 20 on the axis of the lens 17. If the axis of the target 20 is displaced from the axis of the lens 17 this information can be retained by the computer and utilized when determining mask alignment. That is, it is not necessary that both the mask and the wafer be precisely centered with respect to a reference axis. What is important is that the relationship between the mask and the wafer be predetermined. Thus, if the wafer is misaligned with respect to a reference axis, if the mask is also, purposely, misaligned in the same direction and by the same amount, the mask wafer alignment will be proper.

An example of computer programs which can be used is disclosed in U.S. Pat. No. 3,626,384 assigned to the assignee of this invention.

It should be understood that although, the disclosure refers to photomultipliers as light detectors they are not essential to our invention. Rather, phototransistors, photodiodes or photoconductors may be used depending on available light levels. In some applications the collectors may be omitted and the light directed to the photomultiplier, phototransistor, photodiode or the like.

It is thus apparent that the present invention provides a practical and useful measuring tool for precisely locating wafers and performing mask alignment and alignment verification steps necessary to the manufacture of integrated circuits. The present invention enjoys a number of advantages over the present techniques which necessarily employ a human operator in the measurement loop. In the first place, the size of the target utilized is not critical and thus under or over etching of the target is not fatal to the measurement steps. Secondly, the measurement can be effected through transparent dielectric layers. The measurement process can provide information with respect to alignment such that if alignment verification is not effected, steps can be taken to correct the alignment prior to irreversible steps which might impair the usefulness of the wafer. In addition, the apparatus used, although very precisely measuring location, does not require precise location of its internal components. Thus, if the target 19 does not lie exactly in the focal plane of the lens 17 the spot 21 may not be exactly focused but this is not fatal to employing the present invention.

We claim:

1. Appartus for determining part positioning by detecting scattered light from a target with a specular surface, and having light scattering edges located on said part comprising:
    a source of colliminated light,
    first means for rotating light produced by said source to produce a rotating beam of light,
    second means, having an axis, for focusing said rotating light beam to a spot in a plane occupied by said target,
    third means for sensing light scattered from said target edges, said third means located off said axis, and producing an electrical signal in response to said scattered light only,
    fourth means, associated with said first means for providing a second electrical signal indicative of spot location, whereby location and orientation of said part can be determined from said first and second signals.

2. The apparatus of claim 1 wherein said first means includes a rotatably mounted barrel supporting a prism and an optical flat.

3. The apparatus of claim 2 wherein said prism has a thin wedge angle to deviate light from said source and said optical flat is supported at an angle with respect to said light source so as to center said light beam on said second means.

4. The apparatus of claim 1 wherein said third means comprises a ring of optical fibers.

5. The apparatus of claim 1 in which said third means comprises an annular light sensor comprising a plurality of optical fibers.

6. The apparatus of claim 5 in which said light sensor comprises a plurality of angular sections of optical fibers.

7. The apparatus of claim 1 wherein said fourth means comprises an incremental optical encoder.

8. A method of position determination comprising the steps of:
    providing, on a specular surface of an object to be located a target comprising a line pattern of regularly spaced light scattering edges offset from said surface,
    rotating a beam of light focused at a spot, on said object about a reference axis which intersects said target,
    indicating angular position, of said spot, about said axis at discrete intervals,
    and determining from the angular position of said spot when only scattered light is detected, the location and orientation of said target with reference to said reference axis.

9. The method of claim 8 which includes the further step of recording the magnitude of scattered light at said discrete intervals.

10. The method of claim 8 wherein said target is of cruciform shape having four legs, each leg having two light scattering edges.

11. A method of measuring alignment of a mask with respect to a wafer having a specular surface comprising the the steps of:
 a. determining wafer position with reference to a fixed axis by,
  i. providing said wafer with a target comprising a line pattern of regularly spaced light scattering edges offset from said surface,
  ii. rotating a beam of light about said axis,
  iii. focusing said rotating beam to a spot of said wafer adjacent said target, and
  iv. sensing only light scattered by said target edges at predetermined angular positions of said spot,
 b. determining mask position with reference to a second fixed axis, and
 c. determining the alignment of said mask and wafer.

12. The method of claim 11 in which step (b) comprises the steps of,
 i. providing said mask with a target having light blocking form,
 ii. rotating a beam of light about said second fixed axis,
 iii. focusing said rotating beam to a spot on said mask adjacent said target, and
 iv. sensing light transmitted by said mask at predetermined angular positions of said spot.

13. A method of photoresist pattern alignment verification in which a wafer with a surface has a target comprising a line pattern of regularly spaced light scattering edges offset from said surface with a photoresist pattern exposed and developed thereon with a second target having regularly spaced light scattering edges comprising the steps of:
 a. rotating a beam of light about an axis,
 b. focusing said rotating beam to a spot on said wafer,
 c. sensing only light scattered by edges of both said targets at predetermined rotational positions of said spot, and
 d. verifying pattern alignment by relative location and orientation of said first and second targets.

14. The apparatus of claim 1 wherein said third means is located to detect light scattered between 30° and 80° off said axis.

15. A method of part positioning determination for locating positioning of a part with respect to an axis employing a substantially colliminated light source comprising the steps of:
 providing a target on a predetermined area of said part,
 generating a colliminated light beam,
 rotating said light beam about a fixed axis,
 focusing said light beam on said part in the vicinity of said target, and
 detecting light returned from said target to determine positioning of said part wherein:
 the improvement includes a target comprising a line pattern of light scattering edges offset from a surface of said part, and
 said detecting step comprises detecting only light scattered by said edges.

16. The method of claim 15, in which said target edges are regularly spaced.

17. The method of claim 15, wherein said axis is determined by positioning of a lens employed in said focusing step.

18. The method of claim 15, wherein said detecting means is located so as to detect light scattered 30° to 80° off said axis.

* * * * *

UNITED STATES PATENT OFFICE
CERTIFICATE OF CORRECTION

Patent No. 3,989,385  Dated November 2, 1976

Inventor(s) Frederick H. Dill et al.

It is certified that error appears in the above-identified patent and that said Letters Patent are hereby corrected as shown below:

Column 1, line 29, "apparataus" should read -- apparatus --.

Column 3, line 39, "te" should read -- the --.

Signed and Sealed this

Third Day of May 1977

[SEAL]

Attest:

RUTH C. MASON
Attesting Officer

C. MARSHALL DANN
Commissioner of Patents and Trademarks